United States Patent
Nishi

(10) Patent No.: US 11,393,919 B2
(45) Date of Patent: Jul. 19, 2022

(54) SEMICONDUCTOR DEVICE

(71) Applicant: Mitsubishi Electric Corporation, Tokyo (JP)

(72) Inventor: Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/950,200

(22) Filed: Nov. 17, 2020

(65) Prior Publication Data

US 2021/0280576 A1    Sep. 9, 2021

(30) Foreign Application Priority Data

Mar. 9, 2020    (JP) .............................. JP2020-039544

(51) Int. Cl.

| | |
|---|---|
| *H01L 29/739* | (2006.01) |
| *H01L 27/06* | (2006.01) |
| *H01L 29/10* | (2006.01) |
| *H01L 29/861* | (2006.01) |
| *H01L 29/40* | (2006.01) |
| *H01L 29/66* | (2006.01) |

(52) U.S. Cl.
CPC ...... *H01L 29/7397* (2013.01); *H01L 27/0664* (2013.01); *H01L 29/1095* (2013.01); *H01L 29/407* (2013.01); *H01L 29/66068* (2013.01); *H01L 29/66325* (2013.01); *H01L 29/66348* (2013.01); *H01L 29/7393* (2013.01); *H01L 29/8613* (2013.01)

(58) Field of Classification Search
CPC .......... H01L 29/7397; H01L 29/66348; H01L 29/1095
See application file for complete search history.

(56) References Cited

U.S. PATENT DOCUMENTS

2003/0042537 A1 * 3/2003 Nakamura .......... H01L 29/7395
257/328
2013/0328105 A1    12/2013 Matsuura
2015/0123165 A1    5/2015 Omura et al.
(Continued)

FOREIGN PATENT DOCUMENTS

| JP | 2013-258190 A | 12/2013 |
|---|---|---|
| JP | 2014-168106 A | 9/2014 |

(Continued)

*Primary Examiner* — Joseph C. Nicely
(74) *Attorney, Agent, or Firm* — Studebaker & Brackett PC

(57) ABSTRACT

An object of the present disclosure is to provide a semiconductor device capable of lowering the threshold voltage without deteriorating the RBSOA tolerance and manufacturing variation. According to the present disclosure, the semiconductor device includes a drift layer of a first conductivity type, a carrier store layer of the first conductivity type, a base layer of a second conductivity type, an emitter layer of the first conductivity type provided on the first main surface side of the base layer, an active trench provided so as to extend through the emitter layer, the base layer, and the carrier store layer and reach the drift layer, a gate insulating film, a gate electrode, and a collector layer of the second conductivity type provided on a second main surface side of the drift layer, in which peak concentration of impurities in the base layer is $1.0E17$ cm$^{-3}$ or higher.

10 Claims, 12 Drawing Sheets

(56) References Cited

U.S. PATENT DOCUMENTS

| | | | |
|---|---|---|---|
| 2016/0260703 A1* | 9/2016 | Nakamura | H01L 29/407 |
| 2017/0025522 A1* | 1/2017 | Naito | H01L 29/407 |
| 2019/0051738 A1* | 2/2019 | Chen | H02M 7/5395 |
| 2020/0058506 A1* | 2/2020 | Nakamura | H01L 21/304 |
| 2021/0202723 A1* | 7/2021 | Chen | H01L 29/7397 |
| 2021/0217678 A1* | 7/2021 | Hoshi | H01L 21/049 |
| 2021/0265491 A1* | 8/2021 | Son | H01L 29/36 |
| 2021/0280712 A1* | 9/2021 | Hoshi | H01L 29/7397 |

FOREIGN PATENT DOCUMENTS

| | | | | |
|---|---|---|---|---|
| JP | 6440175 B2 | 12/2018 | | |
| WO | WO-2014103256 A1 * | 7/2014 | | H01L 29/7827 |

\* cited by examiner

F I G. 2
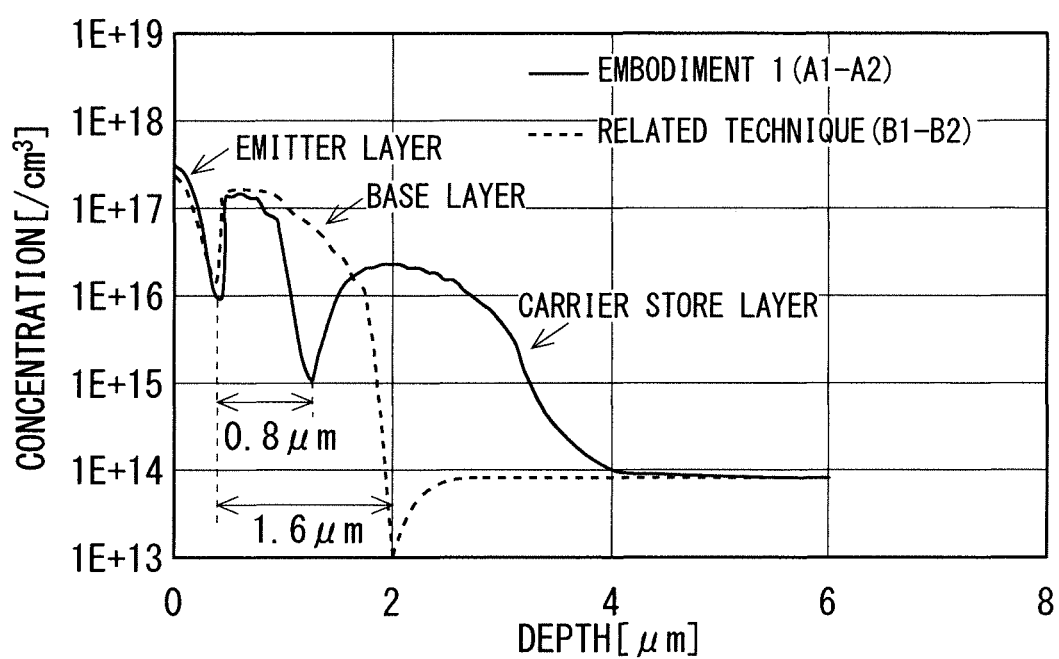

F I G. 3
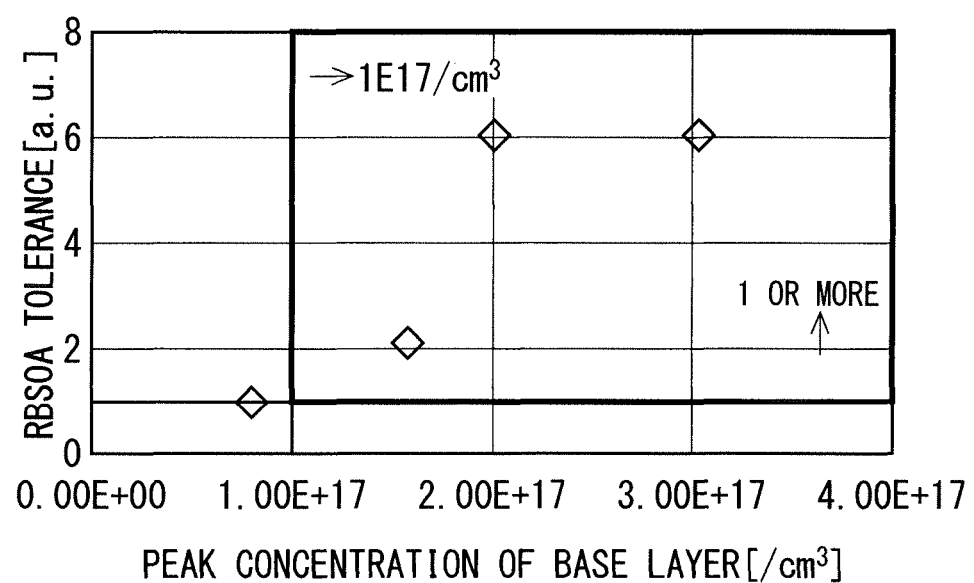

F I G. 4
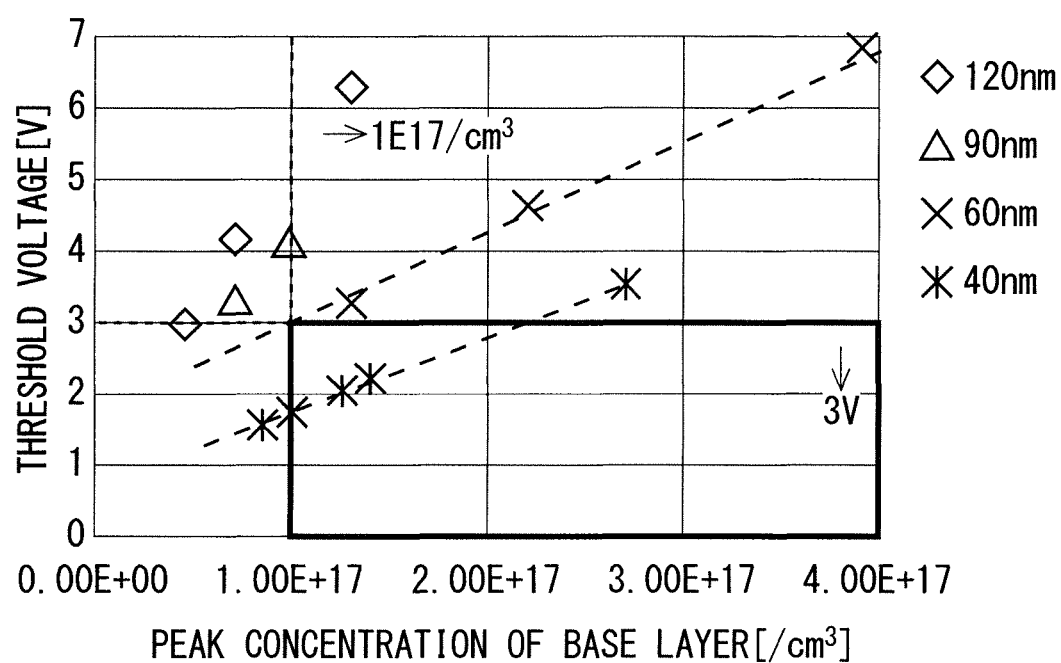

F I G. 8
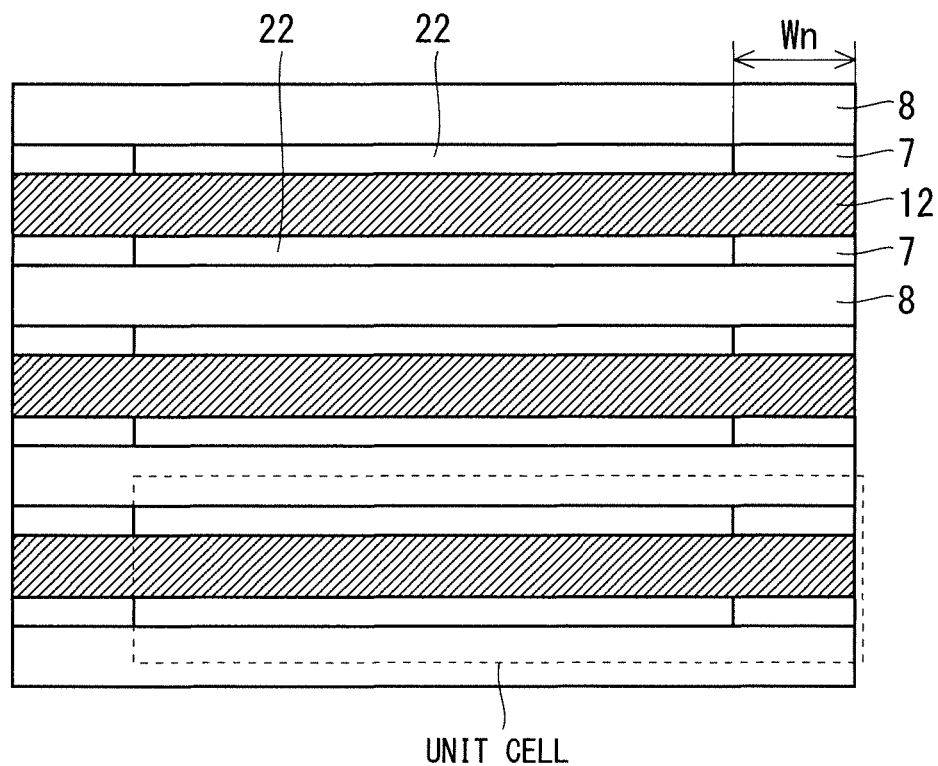

F I G. 1 1
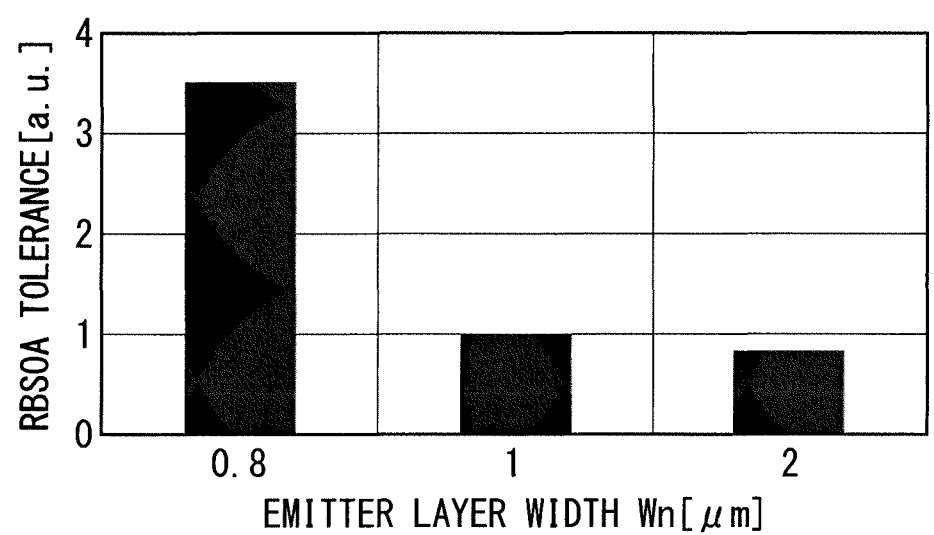

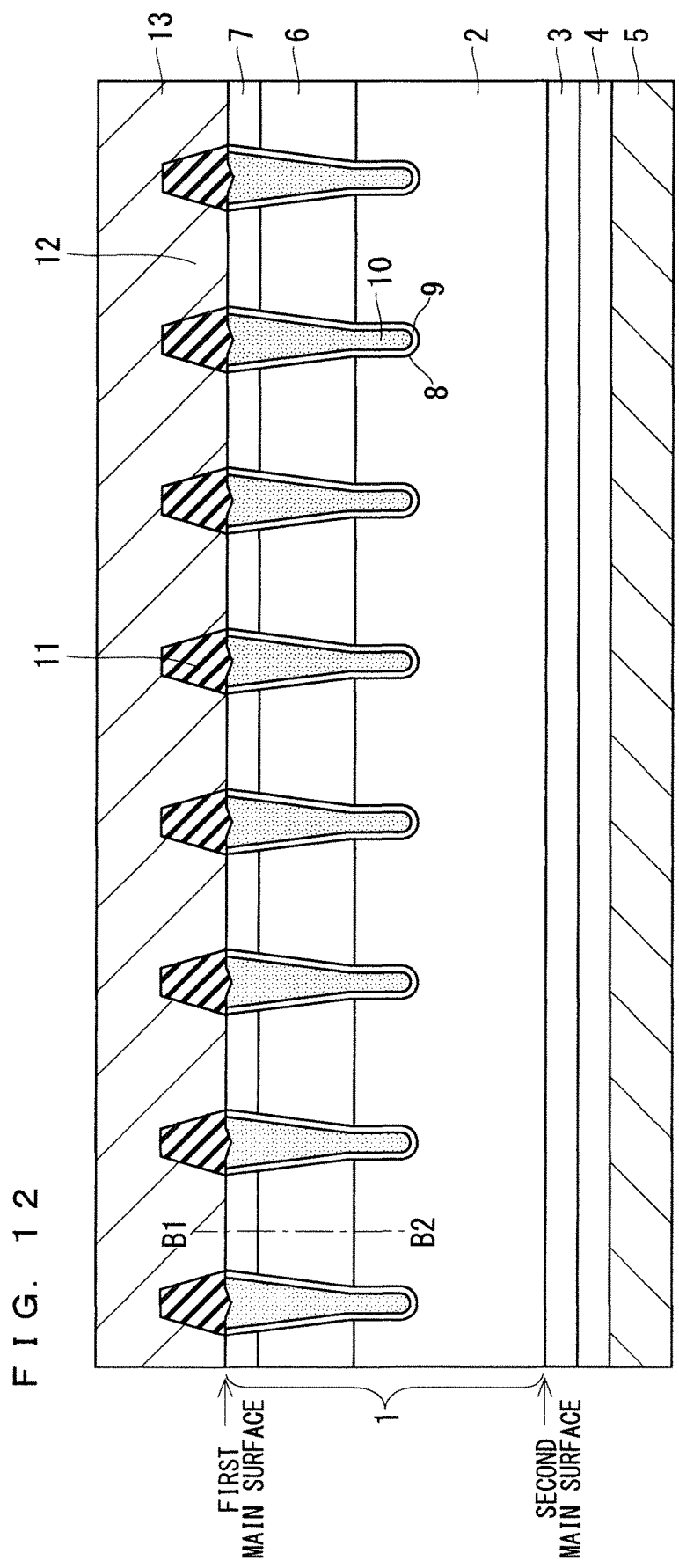

SEMICONDUCTOR DEVICE

BACKGROUND OF THE INVENTION

Field of the Invention

The present disclosure relates to a power semiconductor device.

Description of the Background Art

Conventionally, from the viewpoint of energy saving, Insulated Gate Bipolar Transistors (IGBTs) or diodes have been used in power modules and the like for variable speed control of three-phase motors in such fields as general-purpose inverters and Alternating Current (AC) servo systems. In order to reduce inverter loss, IGBTs and diodes with low switching loss and on-voltage are required.

The threshold voltage of the conventional IGBT is about 6V, and the gate voltage is about 15 V. Therefore, in order to drive the IGBT, a 15 V power source is required in addition to the 5 V power source used in microcomputers and the like. Research is underway to simplify the gate power source by reducing the threshold voltage of the IGBT so that the IGBT can be driven at a gate voltage of 5 V. For example, a structure in which the dimensions of the IGBT are reduced by a constant coefficient has been proposed (see, Japanese Patent No. 6440175).

SUMMARY

It is required to lower the impurity concentration in the base layer or shorten the channel length to lower the threshold voltage of the conventional IGBT. Lowering the impurity concentration in the base layer raises a problem that the Reverse Bias Safe Operation Area (RBSOA) tolerance deteriorates with an increase in pinch resistance.

Further, it is required to lower the drive temperature for activating the base layer or shorten the drive time to shorten the channel length. Lowering the drive temperature raises a problem that the leakage current is increased with the lowering rate of activation of the base layer. Shortening the drive time raises a problem that the variation in the channel length is increased due to the manufacturing variation.

Therefore, the difficulty has lain in lowering the threshold voltage without deteriorating the RBSOA tolerance and manufacturing variation.

An object of the present disclosure is to provide a semiconductor device capable of lowering the threshold voltage without deteriorating the RBSOA tolerance and manufacturing variation.

According to the present disclosure, the semiconductor device includes a drift layer of a first conductivity type, a carrier store layer of the first conductivity type provided on a first main surface side of the drift layer, a base layer of a second conductivity type provided on the first main surface side of the carrier store layer, an emitter layer of the first conductivity type provided on the first main surface side of the base layer, an active trench provided so as to extend through the emitter layer, the base layer, and the carrier store layer and reach the drift layer, a gate insulating film provided on an inner wall of the trench, a gate electrode embedded in the trench through the gate insulating film, and a collector layer of the second conductivity type provided on a second main surface side of the drift layer, in which peak concentration of impurities in the base layer is $1.0E17$ $cm^{-3}$ or higher.

According to the present disclosure, the semiconductor device includes the carrier store layer of the first conductivity type provided on the first main surface side of the drift layer, and the peak concentration of impurities in the base layer is $1.0E17$ $cm^{-3}$ or higher; therefore, the semiconductor device is capable of lowering the threshold voltage without deteriorating the RBSOA tolerance and manufacturing variation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph illustrating impurity concentration distribution in each semiconductor device according to Embodiment 1 and a related technique;

FIG. 3 is a graph illustrating dependency of RBSOA tolerance on the peak concentration of a base layer according to Embodiment 1;

FIG. 4 is a graph illustrating dependency of threshold voltage on the peak concentration of the base layer according to Embodiment 1;

FIG. 8 is a plan view illustrating a configuration example of a semiconductor device according to Embodiment 5;

FIG. 11 is a graph illustrating dependency of RBSOA tolerance on an emitter layer width according to Embodiment 5; and FIG. 12 is a cross-sectional view illustrating a configuration example of the semiconductor device according to the related technique.

DESCRIPTION OF THE PREFERRED EMBODIMENTS

Embodiment 1

Figure 1:
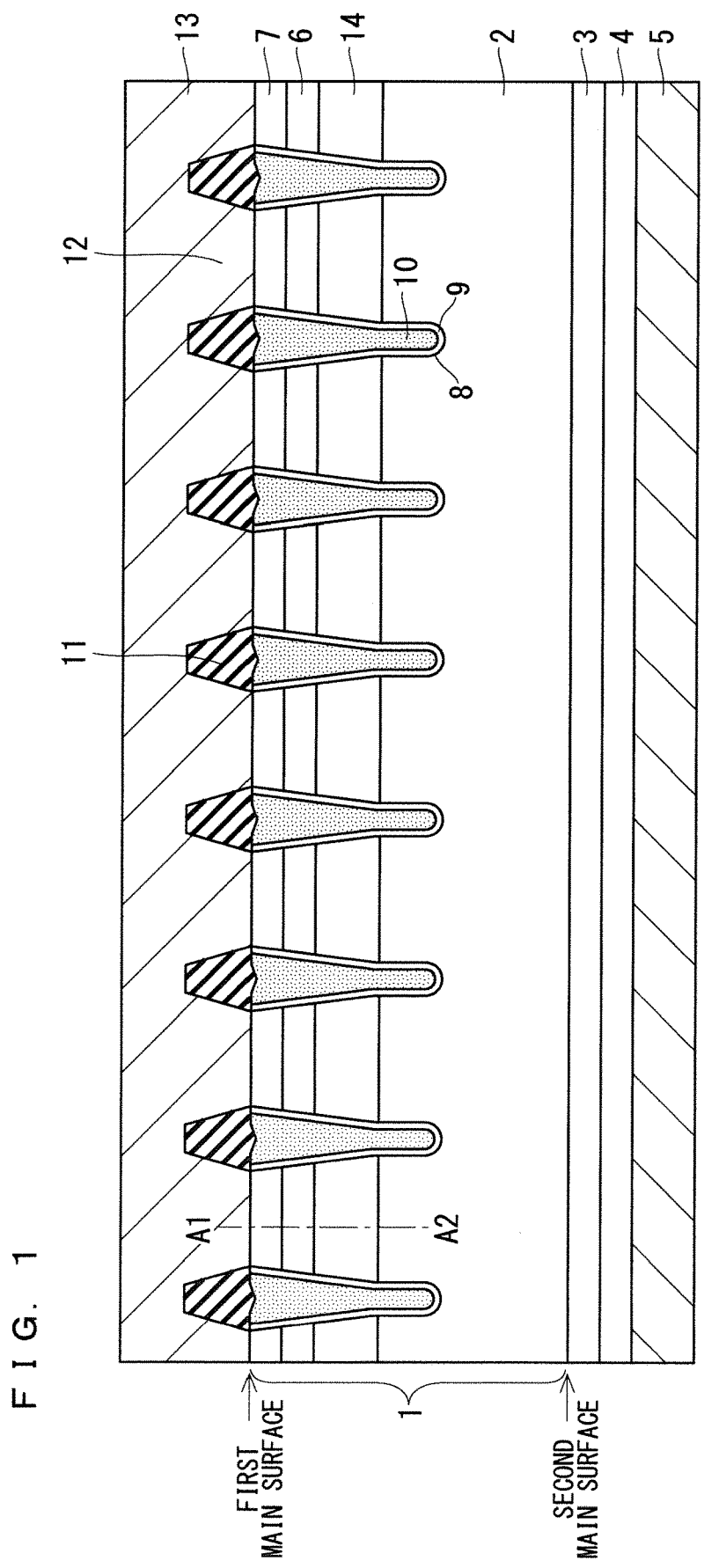
FIG. 1 is a cross-sectional view illustrating a configuration example of a semiconductor device according to Embodiment 1.

FIG. 12 is a cross-sectional view illustrating a configuration example of an IGBT being a semiconductor device according to a related technique. As illustrated in FIG. 12, the semiconductor device according to the related technique includes a semiconductor substrate 1 having a first main surface and a second main surface, an interlayer insulating film 11 and an emitter electrode 13 provided on the first main surface of the semiconductor substrate 1, and a collector electrode 5 provided on the second main surface of the semiconductor substrate 1.

Specifically, in the semiconductor substrate 1, a base layer 6 of a second conductivity type is provided on a drift layer 2 of a first conductivity type on its first main surface side. An emitter layer 7 of the first conductivity type is provided on the first main surface side of the base layer 6. An active trench 8 is provided so as to extend through the emitter layer 7 and the base layer 6 from the first main surface and reach the drift layer 2. An active gate insulating film 9 is provided on the inner wall of the active trench 8. An active gate electrode 10 is embedded in the active trench 8 through the active gate insulating film 9. The interlayer insulating film 11 is provided so as to cover the active gate electrode 10 on its first main surface side. The emitter electrode 13 is provided so as to connect to the semiconductor substrate 1 through a contact hole 12.

Further, in the semiconductor substrate 1, a buffer layer 3 of the first conductivity type is provided on drift layer 2 on its second main surface side. A collector layer 4 of the second conductivity type is provided the buffer layer 3 on its second main surface side.

FIG. 1 is a cross-sectional view illustrating a configuration example of an IGBT being a semiconductor device according to Embodiment 1. As illustrated in FIG. 1, the semiconductor device according to Embodiment 1 is characterized in that a carrier store layer 14 of the first conductivity type is provided between the drift layer 2 and the base layer 6. The active trench 8 is provided so as to extend through the emitter layer 7, the base layer 6, and the carrier store layer 14 from the first main surface and reach the drift layer 2. Other configurations are the same as those of the semiconductor device according to the related technique illustrated in FIG. 12; therefore, the description thereof will be omitted here.

Next, the effect resulting from providing the carrier store layer 14 will be described.

FIG. 2 is a graph illustrating impurity concentration distribution in each semiconductor device according to Embodiment 1 and a related technique. In FIG. 2, the horizontal axis represents the depth of the semiconductor device, and the vertical axis represents the impurity concentration in each layer of the semiconductor device. The solid line indicates the impurity concentration profile in the A1-A2 cross section of the semiconductor device according to Embodiment 1 illustrated in FIG. 1. The broken line indicates the impurity concentration profile in the B1-B2 cross section of the semiconductor device according to the related technique in FIG. 12.

The base layer 6 of each semiconductor device according to Embodiment 1 and the related technique is formed by ion implantation so that the peak concentration of impurities in the base layer 6 is $1.5E17$ $cm^{-3}$. Further, the drive for activating the base layer 6 of each semiconductor device according to Embodiment 1 and the related technique is executed under the conditions of a long driving time in which the influence of manufacturing variation is small enough, at a driving temperature which can sufficiently activate the injected ions. The distance from the boundary between the emitter layer 7 and the base layer 6 to the boundary between the base layer 6 and the drift layer 2 or the carrier store layer 14 is defined as the channel length.

There are three effects resulting from providing the carrier store layer 14. The first effect is that the diffusion in the base layer 6 can be suppressed and the channel length can be shortened. Specifically, the channel length of the semiconductor device according to the related technique is 1.6 μm, whereas the channel length of the semiconductor device according to Embodiment 1 is 0.8 μm.

The second effect is that the minimum impurity concentration in the base layer 6 is raised to $1E15$ $cm^{-3}$ by canceling out the region in the vicinity of the drift layer 2 in the base layer 6 of second conductive type with the carrier store layer 14 of the first conductivity type. Consequently, the variation in the threshold voltage can be reduced. It should be noted that, it is desirable that the minimum impurity concentration of the base layer 6 is higher than the impurity concentration of the drift layer 2 to reduce the variation in the threshold voltage, and more preferably, the minimum impurity concentration of the base layer 6 is 1.5 times or higher than the impurity concentration of the drift layer 2.

The third effect is that the facilitation of the adjustment of the channel length is ensured. The channel length of the semiconductor device according to the related technique is controlled by the drive conditions (the driving temperature and the driving time) of the base layer 6. Meanwhile, the channel length of the semiconductor device according to Embodiment 1 can be controlled by the ion implantation depth for the carrier store layer 14. The typical drive that activates the base layer adopts a batch method in which a plurality of lots are processed at the same time and this involves the difficulty in meticulously adjusting the drive conditions for each of the products. Whereas, ion implantation adopts a single-wafer method in which wafers are processed one by one; therefore, the ion implantation conditions can be meticulously adjusted for each of the products.

FIG. 3 is a graph illustrating dependency of RBSOA tolerance on the peak concentration of impurities of the base layer 6. In FIG. 3, the horizontal axis represents the peak concentration of impurities in the base layer 6, and the vertical axis represents the normalized RBSOA tolerance.

The RBSOA tolerance must be 1 or higher. As illustrated in FIG. 3, it can be seen that the peak concentration of impurities in the base layer 6 needs to be $1.0E17$ $cm^{-3}$ or higher in order to set the RBSOA tolerance to 1 or higher.

FIG. 4 is a graph illustrating dependency of threshold voltage on the peak concentration of impurities in the base layer 6. Specifically, the relationship between the threshold voltage and the peak concentration of impurities in the base layer 6 when the thickness of the active gate insulating film 9 is 40 nm, 60 nm, 90 nm, and 120 nm is illustrated.

As described above, in order to satisfy the RBSOA tolerance, the peak concentration of impurities in the base layer 6 must be $1.0E17$ $cm^{-3}$ or higher. It can be seen that in order to make the threshold voltage 3 V or less that is capable of performing the 5 V drive in such a peak concentration range, the thickness of the active gate insulating film 9 is required to be 60 nm or less as illustrated in FIG. 4.

From the above reason, in the semiconductor device according to Embodiment 1, the carrier store layer 14 of the first conductivity type is provided between the drift layer 2 and the base layer 6, and the peak concentration of impurities in the base layer 6 is $1.0E17$ $cm^3$ or higher. Therefore, the threshold voltage can be lowered without deteriorating the RBSOA tolerance and manufacturing variation.

Further, in the semiconductor device according to Embodiment 1, the thickness of the active gate insulating film 9 is 60 nm or less. Consequently, the semiconductor device can be driven at 5 V, and no separate 15V power source is required unlike in the conventional case.

Embodiment 2

Figure 5:
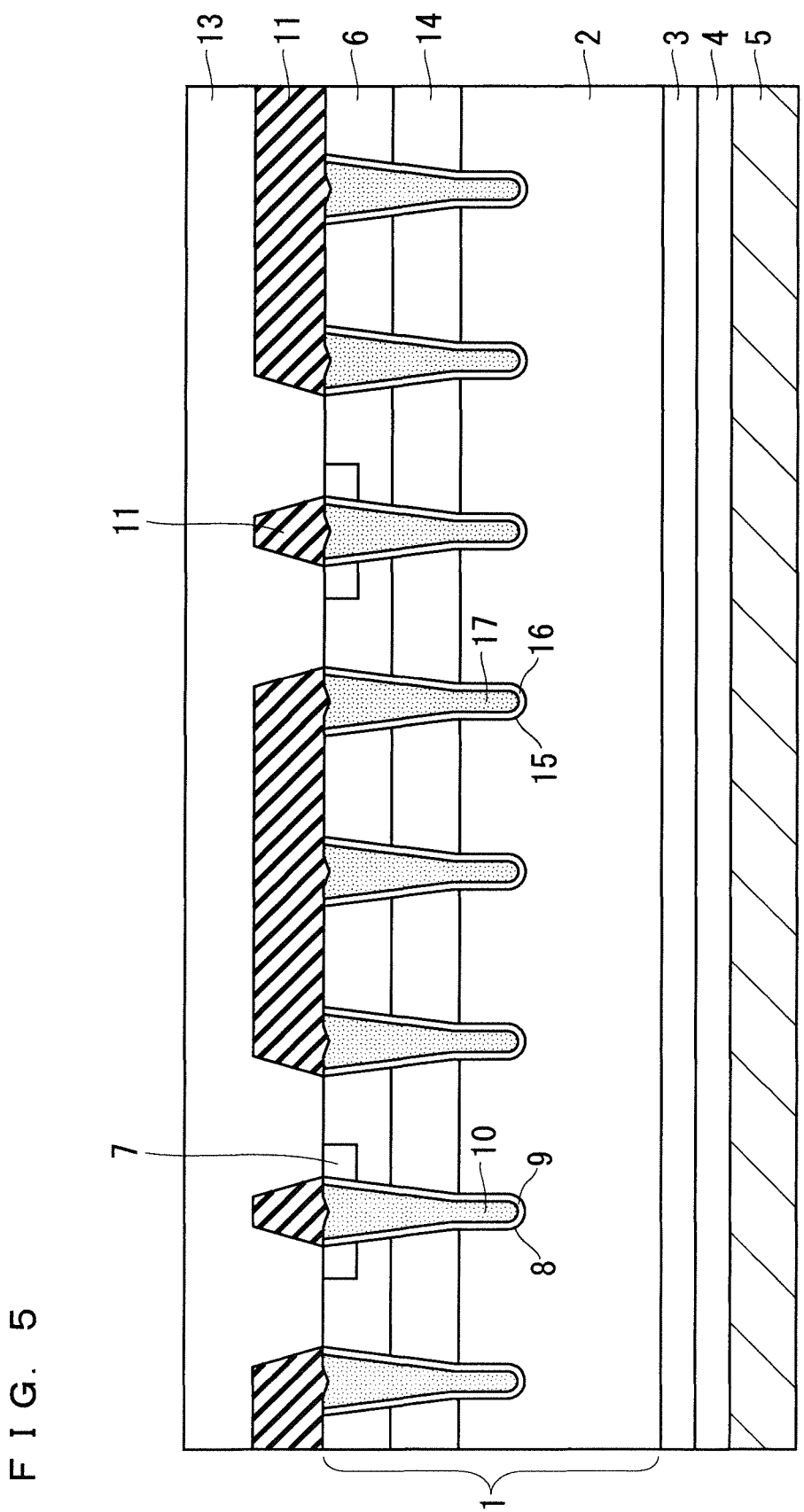
FIG. 5 is a cross-sectional view illustrating a configuration example of a semiconductor device according to Embodiment 2.

FIG. 5 is a cross-sectional view illustrating a configuration example of an IGBT being a semiconductor device according to Embodiment 2. As illustrated in FIG. 5, the semiconductor device according to Embodiment 2 is characterized in that a dummy trench 15, a dummy gate insulating film 16, and a dummy gate electrode 17 are included. Other configurations are the same as those of the semiconductor device according to Embodiment 1; therefore, the detail description thereof will be omitted here.

The dummy trench 15 is provided so as to extend through the emitter layer 7, the base layer 6, and the carrier store layer 14 from the first main surface and reach the drift layer 2. The dummy gate insulating film 16 is provided on the inner wall of the dummy trench 15. The dummy gate electrode 17 is embedded in the dummy trench 15 through the dummy gate insulating film 16.

The interlayer insulating film 11 is provided so as to cover not only the active gate electrode 10 on its first main surface side but also an upper portion of a mesa region between the adjacent dummy trenches 15. As a result, the potential in the mesa region is floating. The potential of the dummy gate electrode 17 may be floating or the same potential as that of the emitter electrode 13.

From the above reason, in the semiconductor device according to Embodiment 2, the mesa region in which the potential is floating is provided, and a carrier of the second conductivity type injected from the collector electrode 5 is accumulated on the first main surface side. Consequently, reduction in on-voltage of the semiconductor device is ensured.

Embodiment 3

Figure 6:
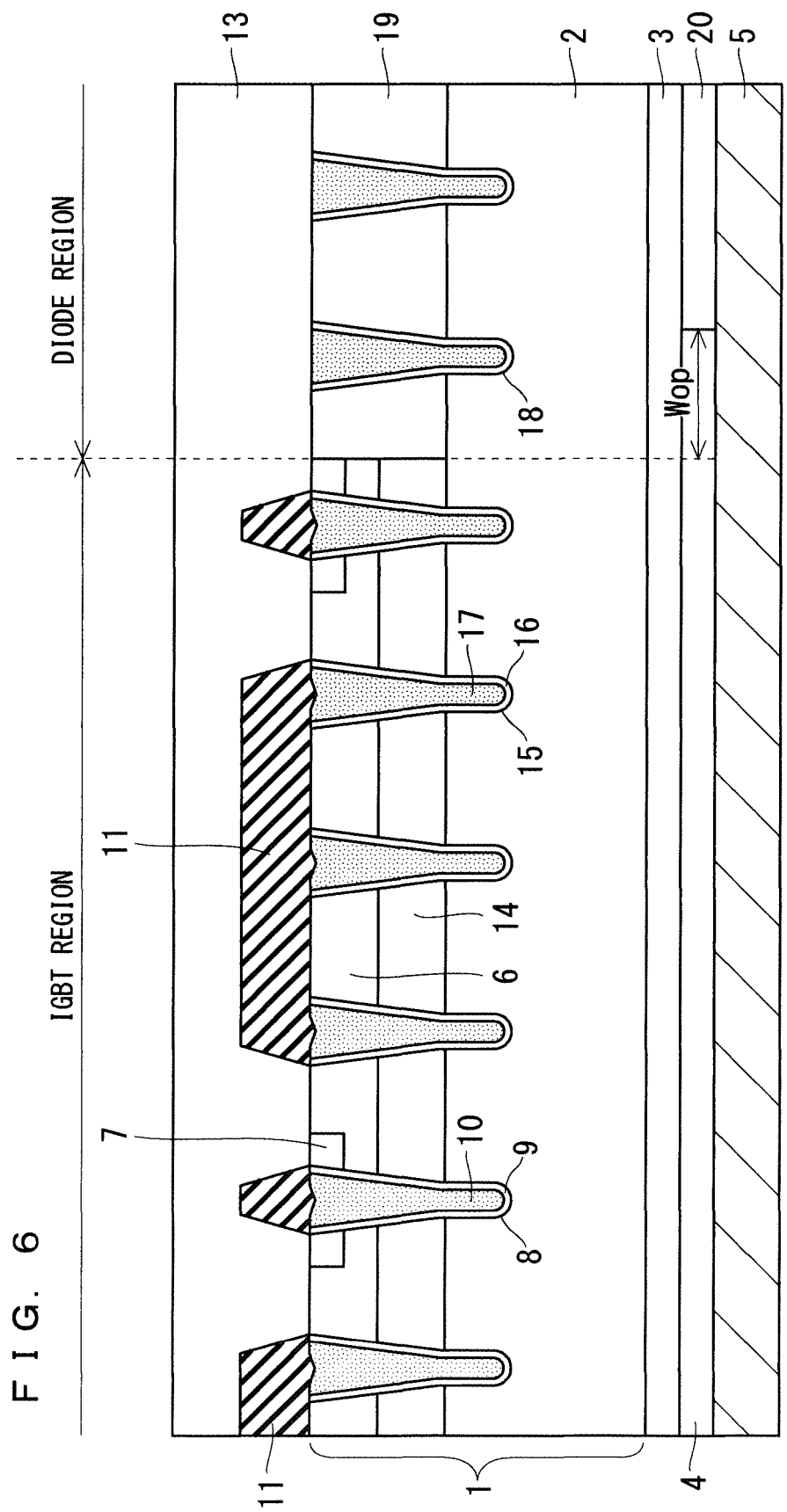
FIG. 6 is a cross-sectional view illustrating a configuration example of a semiconductor device according to Embodiment 3.

FIG. 6 is a cross-sectional view illustrating a configuration example of an IGBT being a semiconductor device according to Embodiment 3. As illustrated in FIG. 6, the semiconductor device according to Embodiment 3 is characterized in that an IGBT region, which is a power semiconductor region, and a diode region are included therein, and the diode region includes a diode trench 18, an anode layer 19, and a cathode layer 20. The configuration of the IGBT region is the same as the configuration of the semiconductor device according to Embodiment 2; therefore, the description thereof will be omitted here. It should be noted that, although a case where the configuration of the IGBT region is the same as the configuration of the semiconductor device according to Embodiment 2 is illustrated, the configuration thereof is not limited thereto. The IGBT region may adopt the same configuration of the semiconductor device according to Embodiment 1.

In the diode region, the anode layer 19 of the second conductivity type is provided on drift layer 2 on its first main surface side. The diode trench 18 is provided so as to extend through the anode layer 19 from the first main surface and reach the drift layer 2. The cathode layer 20 of the first conductivity type is provided on the drift layer 2 on its second main surface side.

A distance Wop between the end portion of the cathode layer 20 in the diode region and the end portion of the emitter layer 7 in the IGBT region may be set to zero or more so that the influence of the IGBT region on the diode region can be reduced.

From the above reason, the semiconductor device according to Embodiment 3 has the IGBT region and the diode region. Therefore, the semiconductor device can be operated as Reverse Conducting (RC)-IGBT.

Embodiment 4

Figure 7:
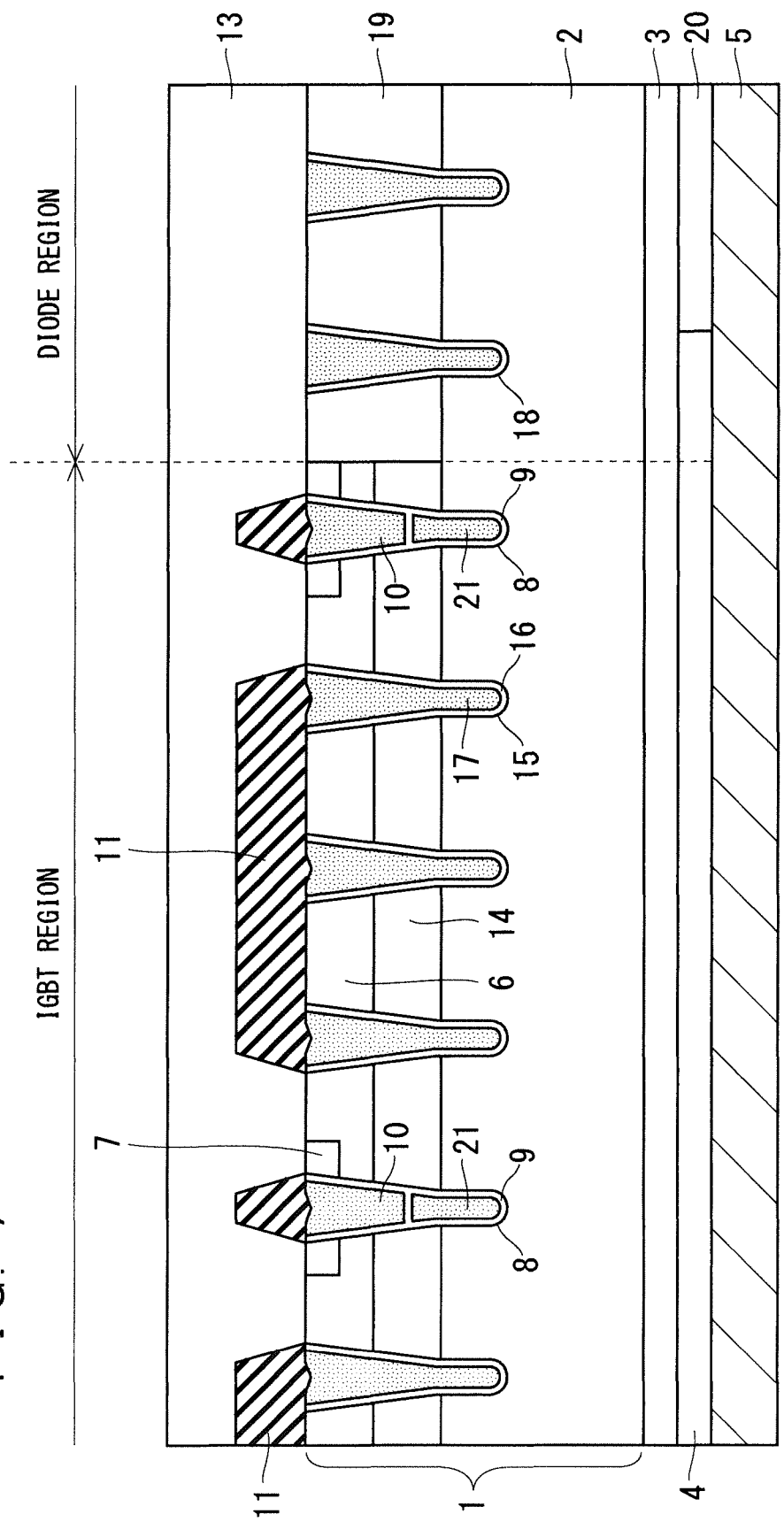
FIG. 7 is a cross-sectional view illustrating a configuration example of a semiconductor device according to Embodiment 4.

FIG. 7 is a cross-sectional view illustrating a configuration example of an IGBT being a semiconductor device according to Embodiment 4. As illustrated in FIG. 7, the semiconductor device according to Embodiment 4 is characterized in that an active gate electrode 10 and a shield electrode 21 are embedded in the active trench 8 through the active gate insulating film 9. Other configurations are the same as Embodiment 3, and description thereof is omitted here. It should be noted that, although a case where the characteristics of Embodiment 4 is applied to the semiconductor device according to Embodiment 3 is illustrated, the configuration thereof is not limited thereto. The characteristics of Embodiment 4 may be applied to the semiconductor device according to Embodiment 1 or Embodiment 2.

The bottom portion of the active gate electrode 10 is located at a position corresponding to the carrier store layer 14 in a cross-sectional view. The upper portion of the shield electrode 21 is located at a position corresponding to the carrier store layer 14 and the bottom portion of the same is located at a position corresponding to the drift layer 2 in a cross-sectional view. An active gate insulating film 9 is interposed between the active gate electrode 10 and the shield electrode 21.

From the above reason, in the semiconductor device according to Embodiment 4, the active gate electrode 10 and the shield electrode 21 are embedded in the active trench 8 through the active gate insulating film 9. By providing the shield electrode 21, the area where the carrier store layer 14 and the active gate electrode 10 face each other through the active gate insulating film 9 is reduced, ensuring the reduction in the feedback capacitance and the input capacitance.

Embodiment 5

FIG. 8 is a plan view illustrating a configuration example of an IGBT being a semiconductor device according to Embodiment 5. As illustrated in FIG. 8, in the semiconductor device according to Embodiment 5, in a plan view, the emitter layers 7 and contact layers 22 of the second conductivity type extend orthogonally to the linearly arranged active trench 8, and also are alternately arranged. Further, the contact holes 12 are arranged in parallel to the active trenches 8. Other configurations are the same as any of Embodiments 1 to 4, and description thereof is omitted here.

Such an arrangement such that the emitter electrodes 7 extend with respect to the active trenches 8 as described above enables to reduce the variation in the saturation current. The mechanism of the above will be explained below with reference to FIGS. 9 and 10.

Figure 9:
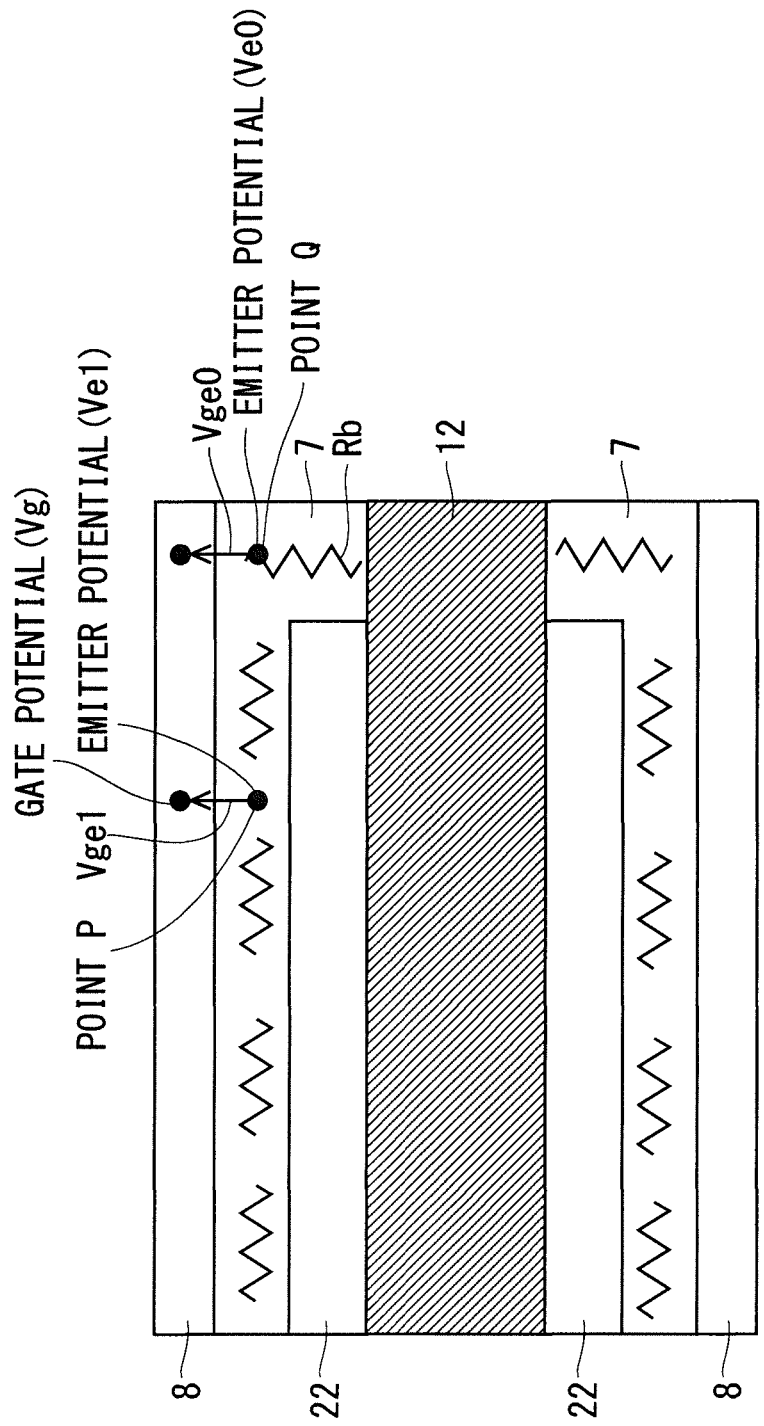
FIG. 9 is a plan view illustrating an example of a unit cell of the semiconductor device according to the related technique.

FIG. 9 is a plan view illustrating an example of a unit cell of the semiconductor device according to the related technique. The emitter layers 7 of the semiconductor device according to the related technique are arranged in a ladder shape.

As illustrated in FIG. 9, in the region where the channel of the trench side wall is formed, when Ve1 represents the emitter potential at a position (point P) away from the contact hole 12 in the region, and Ve0 represents the emitter potential at a position close to the contact hole 12 (point Q), Ve1>Ve0 is established due to the influence of the parasitic resistance Rb of the emitter layer 7. Therefore, the saturation current decreases with the effective gate voltage Vge1 at the point P becoming lower than the gate potential Vg. Also, when the emitter layers 7 are arranged in a ladder shape, it is prone to being affected by dimensional variations.

Figure 10:
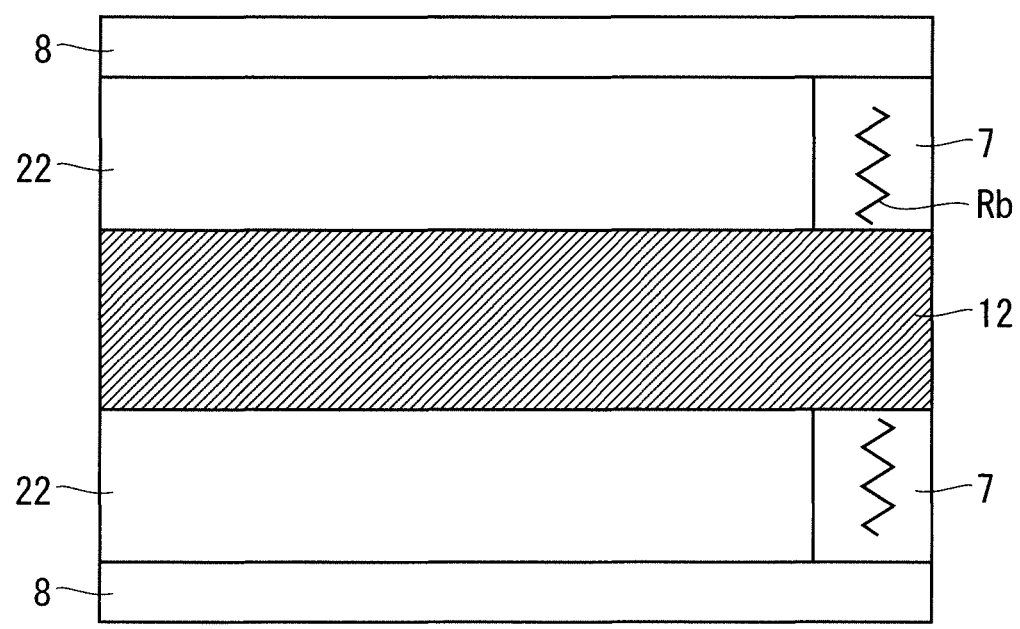
FIG. 10 is a plan view illustrating an example of a unit cell of the semiconductor device according to Embodiment 5.

FIG. 10 is a plan view illustrating an example of a unit cell of the semiconductor device according to Embodiment 5. As illustrated in FIG. 10, when the emitter layers 7 are arranged linearly, the parasitic resistance Rb becomes low, so that the variation in saturation current can be reduced.

As illustrated in FIG. 8, in the semiconductor device according to Embodiment 5, the width Wn in the direction orthogonal to the extending direction of the emitter layer 7 is 1.0 μm or less. Setting the width Wn to 1.0 μm or less reduces the pinch resistance, improving the latch-up resistance. The mechanism of the above will be explained below with reference to FIG. 11.

FIG. 11 is a graph illustrating dependency of RBSOA tolerance on an emitter layer width according to Embodiment 5. In FIG. 11, the horizontal axis represents the emitter layer width Wn, and the vertical axis represents the normalized RBSOA tolerance. The emitter layer width Wn indicates the width Wn in the direction orthogonal to the extending direction of the emitter layer 7. The RBSOA tolerance indicates the current value to be interrupted.

The RBSOA tolerance must be 1 or higher as described in Embodiment 1. As illustrated in FIG. 11, the RBSOA tolerance can be brought up to 1 or more by setting the emitter layer width Wn to 1.0 μm or less.

From the above reason, in the semiconductor device according to Embodiment 5, in a plan view, the emitter layers 7 and contact layers 22 of the second conductivity type extend orthogonally to the linearly arranged active trench 8, and also are arranged alternately. Consequently, the variation in saturation current can be reduced.

Also, in the semiconductor device according to Embodiment 5, the width Wn in the direction orthogonal to the extending direction of the emitter layer 7 is 1.0 μm or less. Therefore, this reduces the pinch resistance and improves the latch-up resistance.

<Modification>

The present disclosure is not limited to the semiconductor devices described in Embodiments 1 to 5 and is adoptable to various developments. For example, as an element structure, the present disclosure is adoptable not only to IGBTs but also to power devices such as Metal Oxide Semiconductor Field Effect Transistors (MOSFETs) and RC-IGBTs. Further, the present disclosure is adoptable regardless of the withstand voltage classes and the types of substrate. Here, as types of substrate, a Floating Zone (FZ) substrate, a Magnetic Czochralski (MCZ) substrate, an epi substrate, and the like are given as examples.

The present disclosure can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a drift layer of a first conductivity type;
   a carrier store layer of the first conductivity type provided on a first main surface side of the drift layer;
   a base layer of a second conductivity type provided on the first main surface side of the carrier store layer;
   an emitter layer of the first conductivity type provided on the first main surface side of the base layer;
   a trench provided so as to extend through the emitter layer, the base layer, and the carrier store layer and reach the drift layer;
   a gate insulating film having a thickness of 60 nm or less provided on an inner wall of the trench;
   a gate electrode embedded in the trench through the gate insulating film; and
   a collector layer of the second conductivity type provided on a second main surface side of the drift layer, wherein
   peak concentration of impurities in the base layer is $1.0E17$ $cm^{-3}$ or higher, and
   the peak concentration of impurities in the base layer and the thickness of the gate insulating film result in a threshold voltage of 3V or less.

2. The semiconductor device according to claim 1, wherein
   the gate insulating film has a thickness of 40 nm or less.

3. The semiconductor device according to claim 1, wherein
   the base layer has a thickness of 1.5 μm or less which is defined by a distance from a boundary between the emitter layer and the base layer to a boundary between the base layer and the carrier store layer.

4. The semiconductor device according to claim 1, wherein
   minimum concentration of impurities in the base layer is 1.5 times or higher than the impurity concentration in the drift layer.

5. The semiconductor device according to claim 1, further comprising:
   a plurality of dummy trenches provided so as to extend through the emitter layer, the base layer, and the carrier store layer and reach the drift layer;
   a dummy gate insulating film provided on an inner wall of each of the plurality of dummy trenches;
   a dummy gate electrode embedded in each of the plurality of dummy trenches through the dummy gate insulating film; and
   an interlayer insulating film provided on an upper portion of a mesa region between the plurality of dummy trenches, wherein
   potential in the mesa region is floating.

6. The semiconductor device according to claim 1, further comprising:
   a power semiconductor region and a diode region, wherein
   the power semiconductor region includes at least the drift layer, the carrier store layer, the base layer, the emitter layer, the trench, the gate insulating film, and the collector layer,
   the diode region includes
   an anode layer of the second conductivity type provided on the first main surface side of the drift layer,
   a diode trench provided so as to extend through the anode layer and reach the drift layer, and
   a cathode layer of the first conductivity type provided on the second main surface side of the drift layer, and
   a distance between an end portion of the cathode layer and an end portion of the emitter layer is 0 or more.

7. The semiconductor device according to claim 1, wherein
   the gate electrode and a shield electrode are embedded in the trench through the gate insulating film,
   a bottom portion of the gate electrode is located at a position corresponding to the carrier store layer in a cross-sectional view, and
   an upper portion of the shield electrode is located at a position corresponding to the carrier store layer and a bottom portion thereof is located at a position corresponding to the drift layer in a cross-sectional view.

8. The semiconductor device according to claim 1, wherein in a plan view, the emitter layer and contact layers of the second conductivity type extend orthogonally to the trench which is linearly arranged, and also are alternately arranged, and a width in a direction orthogonal to an extending direction of the emitter layer is 1.0 μm or less.

9. The semiconductor device according to claim 1, wherein a minimum concentration of impurities in the base layer is approximately $1.0E15$ cm$^{-3}$.

10. The semiconductor device according to claim 1, wherein a concentration of impurities in a region of the base layer, that includes more than half the base layer, is $1E16$ cm$^{-3}$ or more.

* * * * *